United States Patent
Shen et al.

(10) Patent No.: US 11,509,418 B2
(45) Date of Patent: *Nov. 22, 2022

(54) POLAR CODE ENCODING METHOD AND DEVICE

(71) Applicant: HUAWEI TECHNOLOGIES CO., LTD., Guangdong (CN)

(72) Inventors: Hui Shen, Shenzhen (CN); Bin Li, Shenzhen (CN); Jun Chen, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/221,436

(22) Filed: Apr. 2, 2021

(65) Prior Publication Data

US 2021/0297179 A1    Sep. 23, 2021

Related U.S. Application Data

(63) Continuation of application No. 16/706,844, filed on Dec. 9, 2019, now Pat. No. 10,972,216, which is a
(Continued)

(51) Int. Cl.
*H03M 13/00* (2006.01)
*H04L 1/00* (2006.01)
(Continued)

(52) U.S. Cl.
CPC .......... *H04L 1/0041* (2013.01); *H03M 13/05* (2013.01); *H03M 13/13* (2013.01);
(Continued)

(58) Field of Classification Search
CPC ... H04L 1/0041; H04L 1/0043; H04L 1/0057; H04L 1/0071; H04L 9/0858;
(Continued)

(56) References Cited

U.S. PATENT DOCUMENTS 9,917,675 B2    3/2018   Kudekar et al.
11,206,045 B1 * 12/2021  Khan ................ H03M 13/2906
(Continued)

FOREIGN PATENT DOCUMENTS

CN    101577552    11/2009
CN    101577554    11/2009
(Continued)

OTHER PUBLICATIONS

Cadambe et al., Interference Alignment and Spatial Degrees of Freedom for the K User Interference Channel, IEEE International Conference on Communications, pp. 971-975, Institute of Electrical and Electronics Engineers, New York, New York (May 19-23, 2008).

(Continued)

*Primary Examiner* — Christine T. Tu
(74) *Attorney, Agent, or Firm* — Fish & Richardson P.C.

(57) ABSTRACT

Disclosed in an embodiment of the present invention are a polar code encoding method and device, the method comprising: utilizing a common information bit set to represent each of m polar code blocks, the polar codes in each polar code block having the same code length and different code rates, and m being greater than or equal to 2; according to the common information bit set corresponding to the polar code block, acquiring an information bit set corresponding to each polar code in the polar code block; and according to the information bit set corresponding to each polar code in the polar code block, conducting polar code encoding on information to be encoded, thus reducing polar code representation overhead, and solving the problem in the prior art of excessively high polar code representation overhead.

18 Claims, 3 Drawing Sheets representing each Polar code group in m Polar code groups by a common information bit set, where Polar codes in each Polar code group have a same code length and different code rates, and m is greater than or equal to 2 — 101 obtaining an information bit set corresponding to each Polar code in the Polar code group based on the common information bit set corresponding to the Polar code group — 102 performing Polar code encoding on information to be encoded based on the information bit set corresponding to each Polar code in the Polar code group — 103

Related U.S. Application Data continuation of application No. 16/007,966, filed on Jun. 13, 2018, now Pat. No. 10,505,671, which is a continuation of application No. 15/151,320, filed on May 10, 2016, now Pat. No. 10,020,913, which is a continuation of application No. PCT/CN2013/086871, filed on Nov. 11, 2013.

(51) Int. Cl.
  *H03M 13/13* (2006.01)
  *H03M 13/05* (2006.01)

(52) U.S. Cl.
  CPC ....... *H03M 13/611* (2013.01); *H03M 13/618* (2013.01); *H04L 1/0043* (2013.01)

(58) Field of Classification Search
  CPC .... H03M 13/05; H03M 13/13; H03M 13/611; H03M 13/618; H03M 13/134; H03M 13/45
  See application file for complete search history.

(56) References Cited

U.S. PATENT DOCUMENTS

| | | | |
|---|---|---|---|
| 2008/0163027 A1 | 7/2008 | Richardson et al. | |
| 2012/0154183 A1 | 6/2012 | Ang et al. | |
| 2013/0283116 A1* | 10/2013 | Arikan | H04L 1/0041 714/752 |
| 2015/0026543 A1 | 1/2015 | Li et al. | |
| 2015/0092886 A1 | 4/2015 | Ionita et al. | |
| 2015/0295593 A1 | 10/2015 | Trifonov et al. | |
| 2016/0182187 A1 | 6/2016 | Kim et al. | |
| 2016/0254876 A1 | 9/2016 | Shen et al. | |
| 2017/0047947 A1 | 2/2017 | Hong et al. | |
| 2017/0331590 A1 | 11/2017 | Wu et al. | |
| 2018/0006767 A1 | 1/2018 | Litsyn et al. | |
| 2018/0278272 A1* | 9/2018 | Li | H03M 13/6561 |
| 2018/0358985 A1 | 12/2018 | Kim et al. | |
| 2019/0036550 A1 | 1/2019 | Koike-Akino | |

FOREIGN PATENT DOCUMENTS

| | | |
|---|---|---|
| CN | 101217337 | 1/2013 |
| CN | 103023618 | 4/2013 |
| CN | 103368583 | 10/2013 |
| CN | 105684316 | 6/2016 |
| RU | 2395902 | 7/2010 |
| WO | 2012083086 | 6/2012 |

OTHER PUBLICATIONS

Esalami et al.,""A Practical Approach to Polar Codes,""IEEE International Symposium on Information TheoryProceedings,pp. 16-20,Institute of Electronic and Electrical Engineers.New York.(Jul. 31-Aug. 5, 2011).

Li Guiping,""Improving Successive Cancellation Decoder of Polar Codes"",Journal of Xi an Fanyi University,2013, withan English abstract, total 3 pages.

Zhang et al.,"A Low-Complexity Rate-Compatible LDPC Decoder,"Conference Record of the Forty-Third Asllomar Conference on Signals,Systems and Computers,p. 749-753, Institute of Electronic and Electrical Engineers.New York, Nov. 1-4, 2009).

* cited by examiner

POLAR CODE ENCODING METHOD AND DEVICE

CROSS-REFERENCE TO RELATED APPLICATIONS

This application is a continuation of U.S. patent application Ser. No. 16/706,844, filed on Dec. 9, 2019, now U.S. Pat. No. 10,972,216, which is a continuation of U.S. patent application Ser. No. 16/007,966, filed on Jun. 13, 2018, now U.S. Pat. No. 10,505,671, which is a continuation of U.S. patent application Ser. No. 15/151,320, filed on May 10, 2016, now U.S. Pat. No. 10,020,913, which is a continuation of International Patent Application No. PCT/CN2013/086871, filed on Nov. 11, 2013, All of the afore-mentioned patent applications are hereby incorporated by reference in their entireties.

FIELD

The present disclosure relates to the field of communication, and particularly to a polar code encoding method and device.

BACKGROUND

In a communication system, channel encoding is generally used to improve reliability of data transmission and ensure communication quality. A Polar code is a good code which can achieve Shannon capacity by theoretical proof and has a low encoding and decoding complexity. If the code length is short, the performance of conventional successive cancellation (abbreviated as SC) decoding is worse than performances of a low density parity check code (abbreviated as LDPC code) and a Turbo Code. In a case of decoding with list codes, the performance of the Polar code with medium code length is better than performances of the LDPC code or the Turbo Code.

The Polar code is a linear block code, and the generator matrix thereof is $G_N$. The process of Polar code encoding is $x_1^N = u_1^N G_N$, where $x_1^N$ is an output bit after encoding, $u_1^N$ is an input bit before encoding, $G_N = B_N F^{\otimes n}$. The code length $N = 2^n$, and $n \geq 0$. $B_N$ is a transposed matrix such as a bit reversal matrix. $F^{\otimes n}$ is a Kronecker power (Kronecker power) of F, which is defined as $F^{\otimes n} = F \otimes F^{\otimes n-1}$, where $$F = \begin{bmatrix} 1 & 0 \\ 1 & 1 \end{bmatrix}.$$

The Polar code may be represented as $(N, K, A, u_{A^c})$ with a coset code, and the encoding process is $x_1^N = u_A G_N(A) \oplus u_{A^c} G_N(A^c)$ A is an information bit index set. $G_N(A)$ is a submatrix obtained from a row, which corresponds to the index in the set A, in $G_N$. $G_N(A^c)$ is a submatrix obtained from a row, which corresponds to the index in the set $A^c$, in $G_N$. $u_{A^c}$ is Frozen bits the number of which is (N–K), with N being the code length and K being the length of information bits. For simplicity, the Frozen bit may be set to 0, and in this case, the above encoding process is briefly described as $x_1^N = u_A G_N(A)$.

In the conventional technology, a Polar code with a code length being N and a code rate being $R_1$ is represented as $(N, K_1, A_1)$, a second Polar code with a code length being N and a code rate being $R_2$ is represented as $(N, K_2, A_2)$, and a Polar code with a code length being N and a code rate being $R_3$ is represented as $(N, K_3, A_3)$. Polar codes with a same code length and different code rates are represented differently. For example, a first Polar code with the code length being 2048 and the number of information bits being 683 is represented as $(2048, 683, A_1)$, where $A_1$ is a subset including 683 elements of a set $\{0, 1, 2, \ldots, 2047\}$. A second Polar code with the code length being 2048 and the number of information bits being 1024 is represented as $(2048, 1024, A_2)$, where $A_2$ is a subset including 1024 elements of the set $\{0, 1, 2, \ldots, 2047\}$. $A_1$ and $A_2$ include a large number of same elements. However, in the conventional technology, the first Polar code and the second Polar code need to be represented by $A_1$ and $A_2$ respectively, which causes a high overhead for representing the Polar code conventionally.

SUMMARY

A method and an apparatus for Polar code encoding are provided according to embodiments of the disclosure, in which encoding is performed according to representation of Polar codes with a same code length and different code rates based on groups, and the overhead for representing the Polar codes is greatly reduced.

To achieve the above object, technical solutions adopted in the embodiments of the disclosure are as follows.

In a first aspect, a method for Polar code encoding is provided. The method includes:

representing each Polar code group in m Polar code groups by a common information bit set, where Polar codes in each Polar code group have a same code length and different code rates, and m is greater than or equal to 2;

obtaining an information bit set corresponding to each Polar code in the Polar code group based on the common information bit set corresponding to the Polar code group; and performing Polar code encoding on information to be encoded based on the information bit set corresponding to each Polar code in the Polar code group.

In a first possible implementation of the first aspect, according to the first aspect, information bit sets respectively corresponding to all Polar codes with different code rates in each Polar code group include at least one same element.

In a second possible implementation of the first aspect, according to the first aspect or the first possible implementation of the first aspect, the common information bit set corresponding to the Polar code group is a union of information bit sets respectively corresponding to all Polar codes with different code rates in the Polar code group, or is an information bit set corresponding to a Polar code with any code rate in the Polar code group.

In a second aspect, a method for Polar code encoding is provided. The method includes:

representing each Polar code group in m Polar code groups by a common Frozen bit set, where Polar codes in each Polar code group have a same code length and different code rates, and m is greater than or equal to 2;

obtaining a Frozen bit set corresponding to each Polar code in the Polar code group based on the Frozen bit set corresponding to the Polar code group; and performing Polar code encoding on information to be encoded based on the Frozen bit set corresponding to each Polar code in the Polar code group.

In a first possible implementation of the second aspect, in conjunction with the second aspect, Frozen bit sets respectively corresponding to all Polar codes with different code rates in each Polar code group include at least one same element.

In a second possible implementation of the second aspect, in conjunction with the second aspect or the first possible implementation of the second aspect, the common Frozen bit set corresponding to the Polar code group is a union of Frozen bit sets respectively corresponding to all Polar codes with different code rates in the Polar code group, or is a Frozen bit set corresponding to a Polar code with any code rate in the Polar code group.

In a third aspect, an apparatus for Polar code encoding is provided, which includes:

a representing unit configured to represent each Polar code group in m Polar code groups by a common information bit set, where Polar codes in each Polar code group have a same code length and different code rates, and m is greater than or equal to 2;

an obtaining unit configured to obtain an information bit set corresponding to each Polar code in the Polar code group based on the common information bit set corresponding to the Polar code group; and an encoding unit configured to perform Polar code encoding on information to be encoded based on the information bit set corresponding to each Polar code in the Polar code group.

In a first possible implementation of the third aspect, in conjunction with the third aspect, information bit sets respectively corresponding to all Polar codes with different code rates in each Polar code group include at least one same element.

In a second possible implementation of the third aspect, in conjunction with the third aspect or the first possible implementation of the third aspect, the common information bit set corresponding to the Polar code group is a union of information bit sets respectively corresponding to all Polar codes with different code rates in the Polar code group, or is an information bit set corresponding to a Polar code with any code rate in the Polar code group.

In a fourth aspect, an apparatus for Polar code encoding is provided, which includes:

a processor configured to represent each Polar code group in m Polar code groups by a common information bit set, where Polar codes in each Polar code group have a same code length and different code rates, and m is greater than or equal to 2;

obtain a Frozen bit set corresponding to each Polar code in the Polar code group based on the common information bit set corresponding to the Polar code group; and perform Polar code encoding on information to be encoded based on the information bit set corresponding to each Polar code in the Polar code group.

In a first possible implementation of the fourth aspect, in conjunction with the fourth aspect, information bit sets respectively corresponding to all Polar codes with different code rates in each Polar code group include at least one same element.

In a second possible implementation of the fourth aspect, in conjunction with the fourth aspect or the first possible implementation of the fourth aspect, the common information bit set corresponding to the Polar code group is a union of information bit sets respectively corresponding to all Polar codes with different code rates in the Polar code group, or is an information bit set corresponding to a Polar code with any code rate in the Polar code group.

In a fifth aspect, an apparatus for Polar code encoding is provided, which includes:

a representing unit configured to represent each Polar code group in m Polar code groups by a common Frozen bit set, where Polar codes in each Polar code group have a same code length and different code rates, and m is greater than or equal to 2;

an obtaining unit configured to obtain an information bit set corresponding to each Polar code in the Polar code group based on the Frozen bit set corresponding to the Polar code group; and an encoding unit configured to perform Polar code encoding on information to be encoded based on the Frozen bit set corresponding to each Polar code in the Polar code group.

In a first possible implementation of the fifth aspect, in conjunction with the fifth aspect, Frozen bit sets respectively corresponding to all Polar codes with different code rates in each Polar code group include at least one same element.

In a second possible implementation of the fifth aspect, in conjunction with the fifth aspect or the first possible implementation of the fifth aspect, the common Frozen bit set corresponding to the Polar code group is a union of Frozen bit sets respectively corresponding to all Polar codes with different code rates in the Polar code group, or is a Frozen bit set corresponding to a Polar code with any code rate in the Polar code group.

In a sixth aspect, an apparatus for Polar code encoding is provided, which includes:

a processor configured to represent each Polar code group in m Polar code groups by a common Frozen bit set, where Polar codes in each Polar code group have a same code length and different code rates, and m is greater than or equal to 2;

obtain a Frozen bit set corresponding to each Polar code in the Polar code group based on the Frozen bit set corresponding to the Polar code group; and perform Polar code encoding on information to be encoded based on the Frozen bit set corresponding to each Polar code in the Polar code group.

In a first possible implementation of the sixth aspect, in conjunction with the sixth aspect, Frozen bit sets respectively corresponding to all Polar codes with different code rates in each Polar code group include at least one same element.

In a second possible implementation of the sixth aspect, in conjunction with the sixth aspect or the first possible implementation of the sixth aspect, the common Frozen bit set corresponding to the Polar code group is a union of Frozen bit sets respectively corresponding to all Polar codes with different code rates in the Polar code group, or is a Frozen bit set corresponding to a Polar code with any code rate in the Polar code group.

In the methods and apparatuses for Polar code encoding according to the embodiments of the disclosure, each Polar code group in the m Polar code groups is represented by a common information bit set or a common Frozen bit set, where Polar codes in each Polar code group have a same code length and different code rates, and m is greater than or equal to 2; an information bit set or a Frozen bit set corresponding to each Polar code in the Polar code group is obtained based on the common information bit set or the common Frozen bit set corresponding to the Polar code group, and Polar code encoding is performed on information to be encoded based on the information bit set or the Frozen bit set corresponding to each Polar code in the Polar code group. In this way, encoding is performed according to representation of Polar codes with a same code length and different code rates based on groups, which greatly reduces the overhead for representing the Polar codes and addresses the problem of large overhead for representing the Polar codes in the conventional technology, compared with the case that each Polar code is represented by an independent information bit set or an independent Frozen bit set.

BRIEF DESCRIPTION OF THE DRAWINGS

In order to illustrate the technical solutions according to embodiments of the disclosure or in the conventional technology more clearly, the drawings to be used in the description of the embodiments or the conventional technology are described briefly hereinafter. Apparently, the drawings in the description are just a few embodiments of the disclosure, and other drawings may be obtained by those skilled in the art according to those drawings without creative effort.

DETAILED DESCRIPTION OF THE EMBODIMENTS

The technical solutions in embodiments of the disclosure will be described clearly in conjunction with drawings in the embodiments of the disclosure hereinafter. Apparently, the described embodiments are just a few rather than all of embodiments of the disclosure. All other embodiments obtained by those skilled in the art based on the embodiments of the disclosure without any creative work will fall within the protection scope of the disclosure.

It should be noted that, numbers such as 101 and 102 involved in the embodiments of the disclosure are only to identify steps of the method, and not to limit the sequence of the numbered steps.

Figure 1:
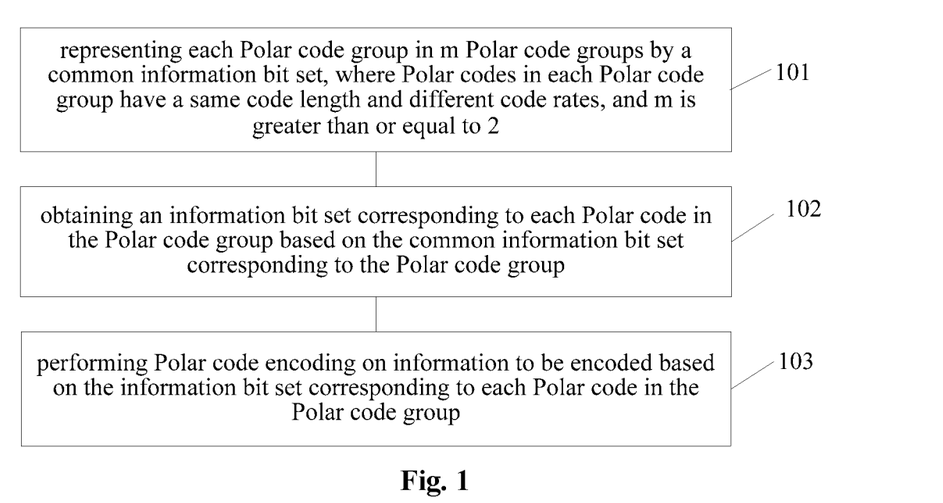
FIG. 1 is a flow chart of a method for Polar code encoding according to an embodiment of the disclosure.

In an aspect, a method for Polar code encoding is provided according to an embodiment of the disclosure. As shown in FIG. 1, the method may include steps 101 to 103.

In 101, each Polar code group in m Polar code groups is represented by a common information bit set, where Polar codes in each Polar code group have a same code length and different code rates and m is greater than or equal to 2.

Exemplarily, multiple Polar codes with a same code length and different code rates may be divided into m Polar code groups, each Polar code group includes one or more Polar codes with different code rates, and information bit sets respectively corresponding to all Polar codes with different code rates in each Polar code group include at least one same element, where m is greater than or equal to 2.

Exemplarily, the code rate of any Polar code is different from each other. In the embodiment of the disclosure, preferably, Polar codes are divided so that Polar codes with the code rates being close to each other are in a Polar code group. The Polar codes may also be divided by using other division methods, and the embodiment of the disclosure is not limited herein. It is only required that information bit indexes included in the information bit sets corresponding to the Polar codes with different code rates in each group include at least one same information bit index. The information bit set corresponding to the Polar code is an information bit index set that can be used by the Polar code, which may be determined by using the method described in the background, or may be determined by using other methods, and the embodiment of the disclosure is not limited therein. For example, an information bit set corresponding to a Polar code with the code length being 2048 and the number of information bits being 683 may be $A_1$, where $A_1$ is a subset including 683 elements of a set $\{0, 1, 2, \ldots, 2047\}$; an information bit set corresponding to a Polar code with the code length being 2048 and the number of information bits being 1024 may be $A_2$, where $A_2$ is a subset including 1024 elements of a set $\{0, 1, 2, \ldots, 2047\}$.

Exemplarily, the Polar codes in each Polar code group may share an information bit set or a Frozen bit set assigned for the group.

For example, for an i-th Polar code group, the common information bit set assigned for the i-th Polar code group is represented by $A_i$, and $|A_i|K_{si}$, where $|A_i|$ and $K_{si}$, represent the total number of elements in the common information bit set $A_i$ of the i-th Polar code group, e.g., $K_{s1}$ represents the total number of elements in the common information bit set $A_1$ of the first Polar code group, and $K_{s2}$ represents the total number of elements in the common information bit set $A_2$ of the second Polar code group.

Each Polar code in any Polar code group may be represented by a common information bit set of the group. The i-th Polar code group is taken as an example for illustration. Each Polar code in the Polar code group may be represented by $(N, K_t)$, where N is the code length, and $K_t$ represents the first $K_t$ information bit indexes of the common information bit set $A_i$ of the Polar code group. Thus, compared to the conventional technology, overhead for representing Polar codes having a same code length and different code rates is saved.

Exemplarily, the common information bit set A corresponding to the i-th Polar code group may be a union of information bit sets respectively corresponding to all Polar codes with different code rates in the i-th Polar code group, or may be an information bit set corresponding to a Polar code with a certain code rate in the i-th Polar code group, or may be obtained by using other methods, and the embodiment of the disclosure is not limited herein. For example, if the i-th Polar code group has three Polar codes, i.e., a Polar code with a code length of 2048 and a code rate of 0.4, a Polar code with a code length of 2048 and a code rate of 0.5, and a Polar code with a code length of 2048 and a code rate of 0.6, then the common information bit set of the i-th Polar code group may be an information bit set corresponding to a code length of 2048 and a code rate of 0.6.

Exemplarily, a recurrence relation is among common information bit sets corresponding to different Polar code groups in the m Polar code groups.

Exemplarily, the recurrence relation may be:

$$\begin{cases} A_1 \\ A_i = A_{i-1} \cup \delta A_i \end{cases},$$

where the set $A_i$ is a common information bit set corresponding to the i-th Polar code group, and $\delta A_i$ is a difference set between the set $A_i$ and the set $A_{i-1}$;

or, $$\begin{cases} A_i \\ A_j = (A_i - \zeta A_j) \cup \delta A_j \end{cases},$$

where the set $A_i$ is a common information bit set corresponding to the i-th Polar code group, the set $A_j$ is a common information bit set corresponding to a j-th Polar code group, $\zeta A_j$ is a difference set between the set $A_i$ and the set $A_j$, and i is not equal to j.

Figure 2:
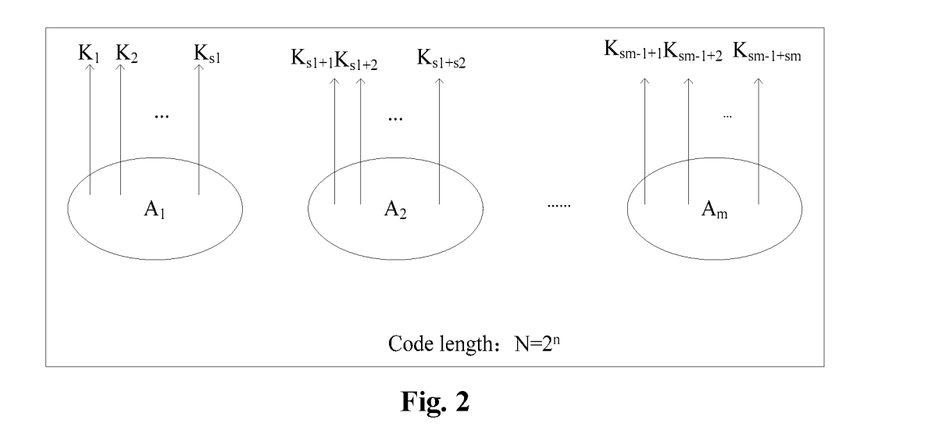
FIG. 2 is a schematic diagram of a common information bit set of each Polar code group according to an embodiment of the disclosure.

Referring to FIG. 2, $A_1$ includes elements of $K_1$, $K_2$, ..., $K_{s1}$, $A_2$ includes elements of $K_{s1+1}$, $K_{s1+2}$, ..., $K_{s1+s2}$, and $A_m$ includes elements of $K_{sm-1+1}$, $K_{sm-1+2}$, ..., $K_{sm-1+sm}$, where a recurrence relation is among $A_1$, $A_2$, ..., $A_m$.

For example, the code length N=16, and $A_1$, $A_2$, $A_3$ correspond to common information bit sets of three Polar code groups respectively, $A_1$={16, 15, 14, 12, 9},
$A_2$={16, 15, 14, 12, 8, 13, 11, 10},
$A_3$={16, 15, 14, 12, 9, 13, 11, 10, 7, 6, 4},
$\delta A_{S2}$={8, 13, 11, 10},
$\zeta A_2$={9},
$\delta A_3$={9, 7, 6, 4},
$\zeta A_3$={8}.

In 102, an information bit set corresponding to each Polar code in the Polar code group is obtained based on the common information bit set corresponding to the Polar code group.

In a case that Polar codes in each Polar code group share a common information bit set assigned for the group, the information bit set corresponding to any Polar code $(N,K_t)$ in the i-th Polar code group includes the first $K_t$ information bit indexes of the common information bit set $A_i$ of the Polar code group represented by $K_t$.

In 103, Polar code encoding is performed on information to be encoded based on the information bit set corresponding to each Polar code in the Polar code group.

Exemplarily, if the number of bits of the information to be encoded is K, there is a Polar code with a certain code length and a certain code rate that corresponds to the bits of the information to be encoded, then the information to be encoded is encoded; if the bits of the information to be encoded are changed, there is a Polar code with another code length and another code rate that corresponds to the changed bits of information to be encoded, then the changed information to be encoded may be encoded.

In the method for Polar code encoding according to the embodiment of the disclosure, each Polar code group in the m Polar code groups is represented by a common information bit set, where Polar codes in each Polar code group have a same code length and different code rates, and m is greater than or equal to 2; an information bit set corresponding to each Polar code in the Polar code group is obtained based on the common information bit set corresponding to the Polar code group, and Polar code encoding is performed on the information to be encoded based on the information bit set corresponding to each Polar code in the Polar code group. In this way, encoding is performed according to representation of Polar codes with a same code length and different code rates based on groups, which greatly reduces the overhead for representing the Polar codes and addresses the problem of large overhead for representing the Polar codes in the conventional technology, compared with the case that each Polar code is represented by an independent information bit set.

Figure 3:
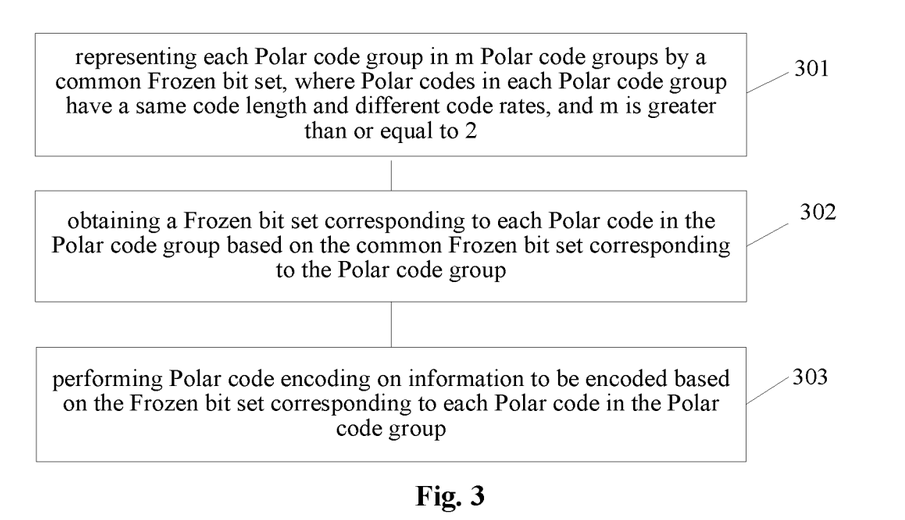
FIG. 3 is a flow chart of another method for Polar code encoding according to an embodiment of the disclosure.

In another aspect, another method for Polar code encoding is provided according to an embodiment of the disclosure. As shown in FIG. 3, the method may include steps 301 to 303.

In 301, each Polar code group in m Polar code groups is represented by a common Frozen bit set, where Polar codes in each Polar code group have a same code length and different code rates, and m is greater than or equal to 2.

Exemplarily, multiple Polar codes with a same code length and different code rates may be divided into m Polar code groups, each Polar code group includes one or more Polar codes with different code rates, and Frozen bit sets respectively corresponding to all Polar codes with different code rates in each Polar code group include at least one same element, where m is greater than or equal to 2.

Exemplarily, the code rate of any Polar code is different from each other. In the embodiment of the disclosure, preferably, Polar codes are divided so that Polar codes with the code rates being close to each other are in a Polar code group. The Polar codes may also be divided by using other division methods, and the embodiment of the disclosure is not limited herein. It is only required that Frozen bit indexes included in the Frozen bit sets corresponding to the Polar codes with different code rates in each Polar code group include at least one same Frozen bit index. The information bit set corresponding to the Polar code is an information bit index set that can be used by the Polar code, which may be determined by using the method described in background, or may be determined by using other methods, and the embodiment of the disclosure is not limited herein. For example, an information bit set corresponding to a Polar code with the code length being 2048 and the number of information bits being 683 may be $A_1$, where $A_1$ is a subset including 683 elements of a set $\{0, 1, 2, \ldots, 2047\}$; an information bit set corresponding to a Polar code with the code length being 2048 and the number of information bits being 1024 may be $A_2$, where $A_2$ is a subset including 1024 elements of the set $\{0, 1, 2, \ldots, 2047\}$.

Exemplarily, the Polar codes in each Polar code group may share a Frozen bit set assigned for the group. For example, for an i-th Polar code group, the common information bit set assigned for the i-th Polar code group is represented by $A_i^c$, and $|A_i^c|=K_{si}$, where $A|_i^c|$ and $K_{si}$ represent the total number of elements in the common Frozen bit set $A_i^c$ of the i-th Polar code group.

Each Polar code may be represented based on a common Frozen bit set of the group. The i-th Polar code group is taken as an example for illustration. Each Polar code in the Polar code group may be represented by $(N,K_t)$, where N is the code length, and $K_t$ represents the first $(N-K_t)$ Frozen bit indexes of the common Frozen bit set $A_i^c$ of the group included in the Frozen bit set corresponding to the Polar code. The information bit set A is complementary to the Frozen bit set $A^c$.

The common Frozen bit set $A_i^c$ corresponding to the i-th Polar code group may be a union of Frozen bit sets respectively corresponding to all Polar codes with different code rates in the i-th Polar code group, or may be a Frozen bit set corresponding to a Polar code with a certain code rate in the i-th Polar code group, or may be obtained by using other methods, and the embodiment of the disclosure is not limited herein. For example, if the i-th Polar code group has three Polar codes, i.e., a Polar code with a code length of 2048 and a code rate of 0.4, a Polar code with a code length of 2048 and a code rate of 0.5, and a Polar code with a code length of 2048 and a code rate of 0.6, then the common Frozen bit set corresponding to the first Polar code group may be a Frozen bit set corresponding to a code length of 2048 and a code rate of 0.4.

A recurrence relation is among common Frozen bit sets corresponding to the m Polar code groups.

For example, the recurrence relation may be:

$$\begin{cases} A_1^c \\ A_i^c = A_{i-1}^c \cup \delta A_i^c \end{cases}$$

where $A_i^c$ is the common Frozen bit set corresponding to the i-th Polar code group, and $\delta A_i^c$ is a difference set between $A_i^c$ and $A_{i-1}^c$;

or, $$\begin{cases} A_i^c \\ A_j^c = (A_i^c - \zeta A_j^c) \cup \delta A_j^c \end{cases}$$

where $A_i^c$ is a common Frozen bit set corresponding to the i-th Polar code group, $A_j^c$ is a common Frozen bit set corresponding to a j-th Polar code group, $\delta A_j^c$ is a difference set between the set $A_i^c$ and the set $A_j^c$, and i is not equal to j.

In 302, a Frozen bit set corresponding to each Polar code in the Polar code group is obtained based on the common Frozen bit set corresponding to the Polar code group.

In a case that the Polar codes in each Polar code group share a common Frozen bit set assigned for the group, the Frozen bit set corresponding to any Polar code (N,$K_t$) in the i-th Polar code group includes the first (N−$K_t$) Frozen bit indexes of the common Frozen bit set $A_i^c$ of the group.

In 303, Polar code encoding is performed on information to be encoded based on the Frozen bit set corresponding to each Polar code in the Polar code group.

Exemplarily, if the number of bits of the information to be encoded is K, there is a Polar code with a certain code length and a certain code rate that corresponds to the bits of the information, then the information to be encoded is encoded; if the bits of the information to be encoded is changed, there is a Polar code with another code length and another code rate that corresponds to the changed bits of information to be encoded, then the changed information to be encoded may be encoded.

In the method for Polar code encoding according to the embodiment of the disclosure, each Polar code group in the m Polar code groups is represented by a common Frozen bit set, where the Polar codes in each Polar code group have a same code length and different code rates, and m is greater than or equal to 2; a Frozen bit set corresponding to each Polar code in the Polar code group is obtained based on the common Frozen bit set corresponding to the Polar code group, and Polar code encoding is performed on the information to be encoded based on the Frozen bit set corresponding to each Polar code in the Polar code group. In this way, encoding is performed according to representation of Polar codes with a same code length and different code rates based on groups, which greatly reduces the overhead for representing the Polar codes and addresses the problem of large overhead for representing the Polar codes in the conventional technology, compared with the case that each Polar code is represented by an independent Frozen bit set.

Figure 4:
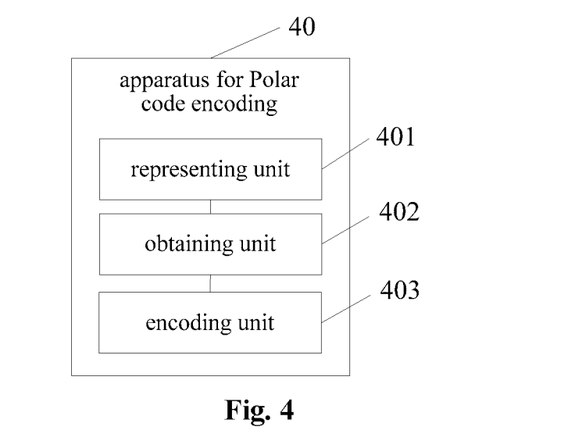
FIG. 4 is a schematic diagram of an apparatus for Polar code encoding according to an embodiment of the disclosure.

In an aspect, an apparatus 40 for Polar code encoding is provided according to an embodiment of the disclosure. The apparatus 40 for Polar code encoding may be an independent apparatus, or may be located in an indoor baseband processing unit in a base station. Referring to FIG. 4, the apparatus 40 for Polar code encoding includes a representing unit 401, an obtaining unit 402, and an encoding unit 403.

The representing unit 401 is configured to represent each Polar code group in m Polar code groups by a common information bit set, where Polar codes in each Polar code group have a same code length and different code rates, and m is greater than or equal to 2.

Exemplarily, the code rate of any Polar code is different from each other. In the embodiment of the disclosure, preferably, Polar codes are divided so that Polar codes with the code rates being close to each other are in a Polar code group. The Polar codes may also be divided by using other division methods, and the embodiment of the disclosure is not limited herein. It is only required that information bit indexes included in the information bit sets corresponding to the Polar codes with different code rates in each group include at least one same information bit index. The information bit set corresponding to the Polar code is an information bit index set that can be used by the Polar code, which may be determined by using the method described in background, or may be determined by using other methods, and the embodiment of the disclosure is not limited therein. For example, an information bit set corresponding to a Polar code with the code length being 2048 and the number of information bits being 683 may be $A_1$, where $A_1$ is a subset including 683 elements of a set {0, 1, 2, . . . , 2047}; an information bit set corresponding to a Polar code with the code length being 2048 and the number of information bits being 1024 may be $A_2$, where $A_2$ is a subset including 1024 elements of the set {0, 1, 2, . . . , 2047}.

Exemplarily, the Polar codes in each Polar code group may share an information bit set or a Frozen bit set assigned for the group.

For example, for an i-th Polar code group, the common information bit set assigned for the i-th Polar code group is represented by $A_i$, and |$A_i$|=$K_{si}$, where |$A_i$| and $K_{si}$ represent the total number of elements in the common information bit set A, of the i-th Polar code group, e.g., $K_{s1}$ represents the total number of elements in the common information bit set $A_1$ of the first Polar code group, and $K_{s2}$ represents the total number of elements in the common information bit set $A_2$ of the second Polar code group.

Each Polar code in any Polar code group may be represented by a common information bit set of the group. The i-th Polar code group is taken as an example for illustration. Each Polar code in the Polar code group may be represented by (N,$K_t$), where N is the code length, and $K_t$ represents the first $K_t$ information bit indexes of the common information bit set $A_i$ of the Polar code group. Thus, compared with the conventional technology, overhead for representing the Polar codes with a same code length and different code rates is saved.

Exemplarily, the common information bit set A corresponding to the i-th Polar code group may be a union of information bit sets respectively corresponding to all Polar codes with different code rates in the i-th Polar code group, or may be an information bit set corresponding to a Polar code with a certain code rate in the i-th Polar code group, or may be obtained by using other methods, and the embodiment of the disclosure is not limited herein. For example, if the i-th Polar code group has three Polar codes, i.e., a Polar code with a code length of 2048 and a code rate of 0.4, a Polar code with a code length of 2048 and a code rate of 0.5, and a Polar code with a code length of 2048 and a code rate of 0.6, then the common information bit set of the i-th Polar code group may be an information bit set corresponding to a code length of 2048 and a code rate of 0.6.

Exemplarily, a recurrence relation is among common information bit sets corresponding to different Polar code groups in the m Polar code groups.

Exemplarily, the recurrence relation may be:

$$\begin{cases} A_1 \\ A_i = (A_{i-1} \cup \delta A_i \end{cases},$$

where the set $A_i$ is a common information bit set corresponding to the i-th Polar code group, and $\delta A_i$ is a difference set between the set $A_i$ and the set $A_{i-1}$;

or, $$\begin{cases} A_i \\ A_j = (A_i - \zeta A_j) \cup \delta A_j \end{cases},$$

where the set $A_i$ is a common information bit set corresponding to the i-th Polar code group, the set $A_j$ is a common information bit set corresponding to a j-th Polar code group, $\zeta A_j$ is a difference set between the set $A_i$ and the set $A_j$, and i is not equal to j.

Referring to FIG. 2, $A_1$ includes elements of $K_1$, $K_2, \ldots, K_{s1}$, $A_2$ includes elements of $K_{s1+1}$, $K_{s1+2}, \ldots, K_{s1+s2}$, and $A_m$ includes elements of $K_{sm-1+1}$, $K_{sm-1+2}, \ldots, K_{sm-1+sm}$, where a recurrence relation is among $A_1$, $A_2, \ldots, A_m$.

For example, the code length N=16, and $A_1$, $A_2$, $A_3$ correspond to common information bit sets of three Polar code groups respectively, $A_1$={16, 15, 14, 12, 9},
$A_2$={16, 15, 14, 12, 8, 13, 11, 10},
$A_3$={16, 15, 14, 12, 9, 13, 11, 10, 7, 6, 4},
$\delta A_{S2}$={8, 13, 11, 10},
$\zeta A_2$={9},
$\delta A_3$={9, 7, 6, 4},
$\zeta A_3$={8}.

The obtaining unit 402 is configured to obtain an information bit set corresponding to each Polar code in the Polar code group based on the common information bit set corresponding to the Polar code group.

In a case that the Polar codes in each Polar code group share a common information bit set assigned for the group, the information bit set corresponding to any Polar code (N,$K_t$) in the i-th Polar code group includes the first $K_t$ information bit indexes of the common information bit set $A_i$ of the Polar code group represented by $K_t$.

The encoding unit 403 is configured to perform Polar code encoding on information to be encoded based on the information bit set corresponding to each Polar code in the Polar code group.

Exemplarily, if the number of bits of the information to be encoded is K, there is a Polar code with a certain code length and a certain code rate that corresponds to the bit of information to be encoded, and then the information to be encoded is encoded; if bits of the information to be encoded is changed, there is a Polar code with another code length and another code rate that corresponds to the changed bits of information to be encoded, and then the changed information to be encoded may be encoded.

In the apparatus 40 for Polar code encoding according to the embodiment of the disclosure, each Polar code group in the m Polar code groups is represented by a common information bit set, where the Polar codes in each Polar code group have a same code length and different code rates, and m is greater than or equal to 2; an information bit set corresponding to each Polar code in the Polar code group is obtained based on the common information bit set corresponding to the Polar code group, and Polar code encoding is performed on the information to be encoded based on the information bit set corresponding to each Polar code in the Polar code group. In this way, encoding is performed according to representation of Polar codes with a same code length and different code rates based on groups, which greatly reduces the overhead for representing the Polar codes and addresses the problem of large overhead for representing the Polar codes in the conventional technology, compared with the case that each Polar code is represented by an independent information bit set.

Figure 5:
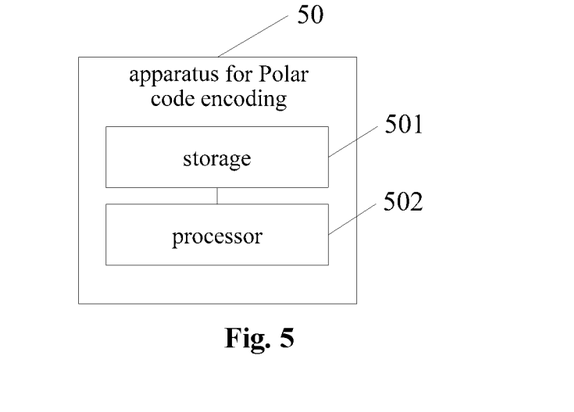
FIG. 5 is a schematic diagram of another apparatus for Polar code encoding according to an embodiment of the disclosure.

In an aspect, another apparatus 50 for Polar code encoding is provided according to an embodiment of the disclosure. Referring to FIG. 5, the apparatus 50 for Polar code encoding includes a storage 501 and a processor 502.

The storage 501 is configured to store Polar codes.

The processor 502 is configured to represent each Polar code group in m Polar code groups by a common information bit set, where Polar codes in each Polar code group have a same code length and different code rates, and m is greater than or equal to 2;

obtain an information bit set corresponding to each Polar code in the Polar code group based on the common information bit set corresponding to the Polar code group; and perform Polar code encoding on information to be encoded based on the information bit set corresponding to each Polar code in the Polar code group.

Exemplarily, the code rate of any Polar code is different from each other. In the embodiment of the disclosure, preferably, Polar codes are divided so that Polar codes with the code rates being close to each other are in a Polar code group. The Polar codes may also be divided by using other division methods, and the embodiment of the disclosure is not limited herein. It is only required that information bit indexes included in the information bit sets corresponding to the Polar codes with different code rates in each group include at least one same information bit index. The information bit set corresponding to the Polar code is an information bit index set that can be used by the Polar code, which may be determined by using the method described in background, or may be determined by using other methods, and the embodiment of the disclosure is not limited herein. For example, an information bit set corresponding to a Polar code with the code length being 2048 and the number of information bits being 683 may be $A_1$, where $A_1$ is a subset including 683 elements of a set {0, 1, 2, . . . , 2047}; an information bit set corresponding to a Polar code with the code length being 2048 and the number of information bits being 1024 may be $A_2$, where $A_2$ is a subset including 1024 elements of the set {0, 1, 2, . . . , 2047}.

Exemplarily, the Polar codes in each Polar code group may share an information bit set or a Frozen bit set assigned for the group.

For example, for an i-th Polar code group, the common information bit set assigned for the i-th Polar code group is represented by $A_i$, and $|A_i|=K_{si}$, where $|A_i|$ and $K_{si}$ represent the total number of elements in the common information bit set $A_i$ of the i-th Polar code group, e.g., $K_{s1}$ represents the total number of elements in the common information bit set $A_1$ of the first Polar code group, and $K_{s2}$ represents the total number of elements in the common information bit set $A_2$ of the second Polar code group.

Each Polar code in any Polar code group may be represented by a common information bit set of the group. The i-th Polar code group is taken as an example for illustration. Each Polar code in the Polar code group may be represented by $(N, K_t)$, where N is the code length, and $K_t$ represents the first $K_t$ information bit indexes of the common information bit set $A_i$ of the Polar code group. Thus, compared to the conventional technology, overhead for representing Polar codes with a same code length and different code rates is saved.

Exemplarily, the common information bit set A corresponding to the i-th Polar code group may be a union of information bit sets respectively corresponding to all Polar codes with different code rates in the i-th Polar code group, or may be an information bit set corresponding to a Polar code with a certain code rate in the i-th Polar code group, or may be obtained by using other methods, and the embodiment of the disclosure is not limited herein. For example, if the i-th Polar code group has three Polar codes, i.e., a Polar code with a code length of 2048 and a code rate of 0.4, a Polar code with a code length of 2048 and a code rate of 0.5, and a Polar code with a code length of 2048 and a code rate of 0.6, then the common information bit set of the i-th Polar code group may be an information bit set corresponding to a code length of 2048 and a code rate of 0.6.

Exemplarily, a recurrence relation is among common information bit sets corresponding to different Polar code groups in the m Polar code groups.

Exemplarily, the recurrence relation may be:

$$\begin{cases} A_1 \\ A_i = (A_{i-1} \cup \delta A_i) \end{cases},$$

where the set $A_i$ is a common information bit set corresponding to the i-th Polar code group, and $\delta A_i$ is a difference set between the set $A_i$ and the set $A_{i-1}$;

or, $$\begin{cases} A_i \\ A_j = (A_i - \zeta A_j) \cup \delta A_j \end{cases},$$

where the set $A_i$ is a common information bit set corresponding to the i-th Polar code group, the set $A_j$ is a common information bit set corresponding to a j-th Polar code group, $\zeta A_j$ is a difference set between the set $A_i$ and the set $A_j$, and i is not equal to j.

Referring to FIG. 2, $A_1$ includes elements of $K_1$, $K_2$, ..., $K_{s1}$, $A_2$ includes elements of $K_{s1+1}$, $K_{s1+2}$, ..., $K_{s1+s2}$, and $A_m$ includes elements of $K_{sm-1+1}$, $K_{sm-1+2}$, ..., $K_{sm-1+sm}$, where a recurrence relation is among $A_1$, $A_2$, ..., $A_m$.

For example, the code length N=16, and $A_1$, $A_2$, $A_3$ correspond to common information bit sets of three Polar code groups respectively, $A_1$={16, 15, 14, 12, 9},
$A_2$={16, 15, 14, 12, 8, 13, 11, 10},
$A_3$={16, 15, 14, 12, 9, 13, 11, 10, 7, 6, 4},
$\delta A_{S2}$={8, 13, 11, 10},
$\zeta A_2$={9},
$\delta A_3$={9, 7, 6, 4},
$\zeta A_3$={8}.

In the apparatus 50 for Polar code encoding according to the embodiment of the disclosure, each Polar code group in the m Polar code groups is represented by a common information bit set, where the Polar codes in each Polar code group have a same code length and different code rates, and m is greater than or equal to 2; an information bit set corresponding to each Polar code in the Polar code group is obtained based on the common information bit set corresponding to the Polar code group, and Polar code encoding is performed on information to be encoded based on the information bit set corresponding to each Polar code in the Polar code group. In this way, encoding is performed according to representation of Polar codes with a same code length and different code rates based on groups, which greatly reduces the overhead for representing the Polar codes and addresses the problem of large overhead for representing the Polar codes in the conventional technology, compared with the case that each Polar code is represented by an independent information bit set.

Figure 6:
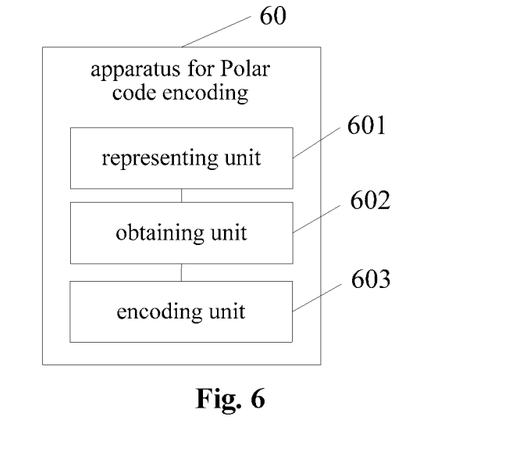
FIG. 6 is a schematic diagram of another apparatus for Polar code encoding according to an embodiment of the disclosure.

In an aspect, an apparatus 60 for Polar code encoding is provided according to an embodiment of the disclosure. The apparatus 60 for Polar code encoding may be an independent apparatus, or may be located in an indoor baseband processing unit in a base station. Referring to FIG. 6, the apparatus 60 for Polar code encoding includes a representing unit 601, an obtaining unit 602, and an encoding unit 603.

The representing unit 601 is configured to represent each Polar code group in m Polar code groups by a common Frozen bit set, where Polar codes in each Polar code group have a same code length and different code rates, and m is greater than or equal to 2.

Exemplarily, the code rate of any Polar code is different from each other. In the embodiment of the disclosure, preferably, Polar code are divided so that Polar codes with the code rates being close to each other are in a Polar code group. The Polar codes may also be divided by using other division methods, and the embodiment of the disclosure is not limited herein. It is only required that Frozen bit indexes included in the Frozen bit sets corresponding to the Polar codes with different code rates in each group include at least one same Frozen bit index. The information bit set corresponding to the Polar code is an information bit index set that can be used by the Polar code, which may be determined by using the method described in background, or may be determined by using other methods, and the embodiment of the disclosure is not limited herein. For example, an information bit set corresponding to a Polar code with the code length being 2048 and the number of information bits being 683 may be $A_1$, where $A_1$ is a subset including 683 elements of a set $\{0, 1, 2, \ldots, 2047\}$; an information bit set corresponding to a Polar code with the code length being 2048 and the number of information bits being 1024 may be $A_2$, where $A_2$ is a subset including 1024 elements of the set $\{0, 1, 2, \ldots, 2047\}$.

Exemplarily, the Polar codes in each Polar code group may share a Frozen bit set set assigned for the i-th Polar code group is represented by $A_i^c$, and $|A_i^c|=K_{si}$, where $A|_i^c|$ and $K_{si}$ represent the total number of elements in the common Frozen bit set $A_i^c$ of the i-th Polar code group.

Each Polar code may be represented based on a common Frozen bit set of the group. The i-th Polar code group is taken as an example for illustration. Each Polar code in the Polar code group may be represented by $(N, K_t)$, where N is the code length, and $K_t$ represents the first $(N-K_t)$ Frozen bit indexes of the common Frozen bit set $A_i^c$ of the group included in the Frozen bit set corresponding to the Polar code. The information bit set A is complementary to the Frozen bit set $A^c$.

The common Frozen bit set $A_i^c$ corresponding to the i-th Polar code group may be a union of Frozen bit sets respectively corresponding to all Polar codes with different code rates in the i-th Polar code group, or may be a Frozen bit set corresponding to a Polar code with a certain code rate in the i-th Polar code group, or may be obtained by using other methods, and the embodiment of the disclosure is not limited herein. For example, if the i-th Polar code group has three Polar codes, i.e., a Polar code with a code length of 2048 and a code rate of 0.4, a Polar code with a code length of 2048 and a code rate of 0.5, and a Polar code with a code length of 2048 and a code rate of 0.6, then the common Frozen bit set corresponding to the first Polar code group may be a Frozen bit set corresponding to a code length of 2048 and a code rate of 0.4.

A recurrence relation is among common Frozen bit sets respectively corresponding to the m Polar code groups.

For example, the recurrence relation may be:

$$\begin{cases} A_1^c \\ A_i^c = A_{i-1}^c \cup \delta A_i^c \end{cases}$$

where $A_i^c$ is the common Frozen bit set corresponding to the i-th Polar code group, and $\delta A_i^c$ is a difference set between $A_i^c$ and $A_{i-1}^c$;
or, $$\begin{cases} A_i^c \\ A_j^c = (A_i^c - \zeta A_j^c) \cup \delta A_j^c \end{cases}$$

where $A_i^c$ is a common Frozen bit set corresponding to the i-th Polar code group, A is a common Frozen bit set corresponding to a j-th Polar code group, $\delta A_i^c$ is a difference set between the set $A_i^c$ and the set $A_j^c$, and i is not equal to j.

The obtaining unit 602 is configured to obtain a Frozen bit set corresponding to each Polar code in the Polar code group based on the Frozen bit set corresponding to the Polar code group.

In a case that the Polar codes in each Polar code group share a common Frozen bit set assigned for the group, the Frozen bit set corresponding to any Polar code (N,$K_t$) in the i-th Polar code group includes the first (N–$K_t$) Frozen bit indexes of the common Frozen bit set $A_i^c$ of the group.

The encoding unit 603 is configured to perform Polar code encoding on information to be encoded based on the Frozen bit set corresponding to each Polar code in the Polar code group.

Exemplarily, if the number of bits of the information to be encoded is K, there is a Polar code with a certain code length and a certain code rate that corresponds to the bits of information to be encoded, and then the information to be encoded is encoded; if the bits of the information to be encoded is changed, there is a Polar code with another code length and another code rate that corresponds to the changed bits of information to be encoded, and then the changed information to be encoded may be encoded.

In the apparatus 60 for Polar code encoding according to the embodiment of the disclosure, each Polar code group in the m Polar code groups is represented by a common Frozen bit set, where the Polar codes in each Polar code group have a same code length and different code rates, and m is greater than or equal to 2; a Frozen bit set corresponding to each Polar code in the Polar code group is obtained based on the common Frozen bit set corresponding to the Polar code group, and Polar code encoding is performed on the information to be encoded based on the Frozen bit set corresponding to each Polar code in the Polar code group. In this way, encoding is performed according to representation of Polar codes with a same code length and different code rates based on groups, which greatly reduces the overhead for representing the Polar codes and addresses the problem of large overhead for representing the Polar codes in the conventional technology, compared with the case that each Polar code is represented by an independent Frozen bit set.

Figure 7:
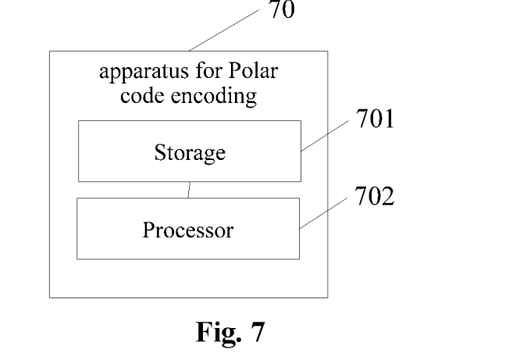
FIG. 7 is a schematic diagram of another apparatus for Polar code encoding according to an embodiment of the disclosure.

In an aspect, another apparatus 70 for Polar code encoding is provided according to an embodiment of the disclosure. Referring to FIG. 7, the apparatus 70 for Polar code encoding includes a storage 701 and a processor 702.

The storage 701 is configured to store Polar codes.

The processor 702 is configured to represent each Polar code group in m Polar code groups by a common Frozen bit set, where Polar codes in each Polar code group have a same code length and different code rates, and m is greater than or equal to 2;

obtain a Frozen bit set corresponding to each Polar code in the Polar code group based on the Frozen bit set corresponding to the Polar code group; and perform Polar code encoding on information to be encoded based on the Frozen bit set corresponding to each Polar code in the Polar code group.

Exemplarily, the code rate of any Polar code is different from each other. In the embodiment of the disclosure, preferably, Polar codes are divided so that Polar codes with the code rates being close to each other are in a Polar code group. The Polar codes may also be divided by using other division methods, and the embodiment of the disclosure is not limited herein. It is only required that Frozen bit indexes included in the Frozen bit sets corresponding to the Polar codes with different code rates in each group include at least one same Frozen bit index. The information bit set corresponding to the Polar code is an information bit index set that can be used by the Polar code, which may be determined by using the method described in background, or may be determined by using other methods, and the embodiment of the disclosure is not limited herein. For example, an information bit set corresponding to a Polar code with the code length being 2048 and the number of information bits being 683 may be $A_1$, where $A_1$ is a subset including 683 elements of a set $\{0, 1, 2, \ldots, 2047\}$; an information bit set corresponding to a Polar code with the code length being 2048 and the number of information bits being 1024 may be $A_2$, where $A_2$ is a subset including 1024 elements of the set $\{0, 1, 2, \ldots, 2047\}$.

Exemplarily, the Polar codes in each Polar code group may share a Frozen bit set assigned for the group. For example, for an i-th Polar code group, the common information bit set assigned for the i-th Polar code group is represented by $A_i^c$, and $|A_i^c|=K_{si}$, where $A|_i^c|$ and $K_{si}$ represent the total number of elements in the common Frozen bit set $A_i^c$ of the i-th Polar code group.

Each Polar code may be represented based on a common Frozen bit set of the group. The i-th Polar code group is taken as an example for illustration. Each Polar code in the Polar code group may be represented by (N,$K_t$), where N is the code length, and $K_t$ represents the first (N–$K_t$) Frozen bit indexes of the common Frozen bit set $A_i^c$ of the group included in the Frozen bit set corresponding to the Polar code. The information bit set A is complementary to the Frozen bit set $A^c$.

The common Frozen bit set $A_i^c$ corresponding to the i-th Polar code group may be a union of Frozen bit sets corresponding to all Polar codes with different code rates in the i-th Polar code group, or may be a Frozen bit set corresponding to a Polar codes with a certain code rate in the i-th Polar code group, or may be obtained by using other methods, and the embodiment of the disclosure is not limited herein. For example, if the i-th Polar code group has three Polar codes, i.e., a Polar code with a code length of 2048 and a code rate of 0.4, a Polar code with a code length of 2048 and a code rate of 0.5, and a Polar code with a code length of 2048 and a code rate of 0.6, then the common Frozen bit set corresponding to the first Polar code group may be a Frozen bit set corresponding to a code length of 2048 and a code rate of 0.4.

A recurrence relation is among common Frozen bit sets respectively corresponding to the m Polar code groups.

For example, the recurrence relation may be:

$$\begin{cases} A_1^c \\ A_i^c = A_{i-1}^c \cup \delta A_i^c \end{cases}$$

where $A_i^c$ is a common Frozen bit set corresponding to the i-th Polar code group, and $\delta A_i^c$ is a difference set between $A_i^c$ and $A_{i-1}^c$;
or, $$\begin{cases} A_i^c \\ A_j^c = (A_i^c - \zeta A_j^c) \cup \delta A_j^c \end{cases}$$

where $A_i^c$ is a common Frozen bit set corresponding to the i-th Polar code group, $A_j^c$ is a common Frozen bit set corresponding to a j-th Polar code group, $\delta A_i^c$ is a difference set between the set $A_i^c$ and the set $A_j^c$, and i is not equal to j.

In the apparatus 70 for Polar code encoding according to the embodiment of the disclosure, each Polar code group in the m Polar code groups is represented by a common Frozen bit set, where the Polar codes in each Polar code group have a same code length and different code rates, and m is greater than or equal to 2; a Frozen bit set corresponding to each Polar code in the Polar code group is obtained based on the common Frozen bit set corresponding to the Polar code group, and Polar code encoding is performed on the information to be encoded based on the Frozen bit set corresponding to each Polar code in the Polar code group. In this way, encoding is performed according to representation of Polar codes with a same code length and different code rates based on groups, which greatly reduces the overhead for representing the Polar codes and addresses the problem of large overhead for representing the Polar codes in the conventional technology, compared with the case that each Polar code is represented by an independent Frozen bit set.

Those skilled in the art should clearly know that, for convenience and concision of description, for the operation of the systems, apparatuses and units mentioned above, one can refer to corresponding processes in the method embodiments, which is not repeated herein.

It should be understood that, in the embodiments of the disclosure, the disclosed systems, apparatuses and methods may be implemented in other ways. For example, the device embodiments described above are just exemplary. The units are divided based on logical functions, and may also be divided in other ways in practical implementation. Multiple units or components may be combined or integrated into another system, or some features may be ignored or not executed. In addition, the displayed or discussed couplings, direct couplings or communication connections may be indirect couplings or communication connections through some interfaces, apparatuses or units, which may be electrical, mechanical or in other forms.

The units described as separate components may be or may not be separated physically. The components shown as units may be or may not be physical units, i.e., the units may be located at one place or may be distributed onto multiple network units. All of or part of the units may be selected based on actual needs to achieve the purposes according to the embodiments of the disclosure.

In addition, individual function units according to the embodiments of the disclosure may be integrated in one processing unit, or the units may exist separately, or two or more units may be integrated in one unit. The foregoing integrated units may be realized in a form of hardware, or realized in a form of combination of hardware and software functional units.

The integrated unit implemented in the form of software function unit may be stored in a computer readable storage medium. The software function unit mentioned above is stored in a storage medium and includes several instructions for instructing a computer device (which may be a personal computer, a server, a network device or the like) to implement part of the steps of the methods according to the embodiments of the disclosure. The foregoing storage medium includes various media that can store program codes, for example, USB disk, mobile hard disk drive, read-only memory (abbreviated as ROM), random access memory (abbreviated as RAM), magnetic disk, optical disk and the like.

It should be noted that, the embodiments mentioned above are only to illustrate the technical solutions of the disclosure, rather than to limit the scope of the disclosure. Though the disclosure is described in detail according to the embodiments mentioned above, those skilled in the art should understand that, the technical solution according to the embodiments mentioned above may be modified, or some technical features may be substituted equivalently; and these modifications or substitutions do not make the essence of the corresponding technical solution depart from the spirit and scope of the technical solutions in the embodiments of the disclosure.

What is claimed is:

1. A channel coding method, performed by a coding device in a communication system, comprising:
   obtaining a common index set based on a code length and a code rate;
   obtaining a first index set from the common index set, wherein the first index set comprises K indexes, and the common index set comprises the first index set and a second index set;
   polar encoding K data bits according to the first index set, to obtain a first polar code comprising an encoded bit sequence, wherein K is an integer greater than or equal to 1 and the encoded bit sequence has a length of N, wherein N is a positive integer; and
   outputting the first polar code;
   wherein the first polar code is one of a plurality of polar codes having same length N, and the plurality of polar codes comprises a second polar code, wherein the second polar code is generated by polar encoding one or more data bits according to the second index set obtained from the common index set.

2. The method according to claim 1, wherein the common index set is a union of index sets respectively corresponding to all polar codes in the plurality of polar codes.

3. The method according to claim 1, wherein the first polar code and the second polar code have different code rates.

4. The method according to claim 1, wherein the plurality of polar codes form a group of polar codes, which is one of m groups of polar codes, and wherein there is a recurrence relation among common index sets corresponding respectively to the m groups of polar codes, wherein m is greater than or equal to 2.

5. The method according to claim 4, wherein the recurrence relation among the common index sets corresponding respectively to the m groups of polar codes is:

$$\begin{cases} A_1 \\ A_i = A_{i-1} \cup \delta A_i \end{cases},$$

wherein $A_i$ is a common index set corresponding to an i-th group of polar codes, i is an integer greater than 1 and smaller or equal to m, and $\delta A_i$ is a difference set between $A_i$ and $A_{i-1}$.

6. The method according to claim 1, wherein the first index set is an information bit index set for polar encoding the K data bits.

7. The method according to claim 1, wherein polar encoding the K data bits according to the first index set comprises:
obtaining a K-bit first sequence based on the K data bits and the first index set;
generating a second sequence, wherein the second sequence comprises N bits, N is an integer power of 2 and is greater than K, and K bit-positions of the second sequence are occupied by the K data bits of the K-bit first sequence;
encoding the second sequence according to an encoding process of $x_1^N = u_1^N G_N$, wherein $G_N$ is a Polar code generating matrix of N rows×N columns, $u_1^N$ is the second sequence, and $x_1^N$ is the encoded bit sequence.

8. An apparatus for channel coding, comprising:
at least one processor; and
one or more memories coupled to the at least one processor and storing programming instructions for execution by the at least one processor, the programming instructions causing the apparatus to:
obtain a common index set based on a code length and a code rate;
obtain a first index set from the common index set, wherein the first index set comprises K indexes, and the common index set comprises the first index set and a second index set;
polar encode K data bits according to the first index set, to obtain a first polar code comprising an encoded bit sequence, wherein K is an integer greater than or equal to 1 and the encoded bit sequence has a length of N, wherein N is a positive integer; and
output the first polar code;
wherein the first polar code is one of a plurality of polar codes having same length N, the plurality of polar codes comprises a second polar code, and the second polar code is generated by polar encoding one or more data bits according to the second index set obtained from the common index set.

9. The apparatus according to claim 8, wherein the common index set is a union of index sets respectively corresponding to all polar codes in the plurality of polar codes.

10. The apparatus according to claim 8, wherein the first polar code and the second polar code have different code rates.

11. The apparatus according to claim 8, wherein the plurality of polar codes form a group of polar codes, which is one of m groups of polar codes, and wherein there is a recurrence relation among common index sets corresponding respectively to the m groups of polar codes, wherein m is greater than or equal to 2.

12. The apparatus according to claim 11, wherein the recurrence relation among the common index sets corresponding respectively to the m groups of polar codes is:

$$\begin{cases} A_1 \\ A_i = A_{i-1} \cup \delta A_i \end{cases},$$

wherein $A_i$ is a common index set corresponding to an i-th group of polar codes, i is an integer greater than 1 and smaller or equal to m, and $\delta A_i$ is a difference set between $A_i$ and $A_{i-1}$.

13. The apparatus according to claim 8, wherein the first index set is an information bit index set for polar encoding the K data bits.

14. The apparatus according to claim 8, wherein in polar encoding the K data bits according to the first index set, the program instructions cause the apparatus to:
obtain a K-bit first sequence based on the K data bits and the first index set;
generate a second sequence, wherein the second sequence comprises N bits, N is an integer power of 2 and is greater than K, and K bit-positions of the second sequence are occupied by the K data bits of the K-bit first sequence;
encode the second sequence according to an encoding process of $x_1^N = u_1^N G_N$,
wherein $G_N$ is a Polar code generating matrix of N rows×N columns, $u_1^N$ is the second sequence, and $x_1^N$ is the encoded bit sequence.

15. A non-transitory, computer-readable medium storing one or more instructions executable by a computer system to perform operations comprising:
obtaining a common index set based on a code length and a code rate;
obtaining a first index set from the common index set, wherein the first index set comprises K indexes, and the common index set comprises the first index set and a second index set;
polar encoding K data bits according to the first index set, to obtain a first polar code comprising an encoded bit sequence, wherein K is an integer greater than or equal to 1 and the encoded bit sequence has a length of N, wherein N is a positive integer; and
outputting the first polar code;
wherein the first polar code is one of a plurality of polar codes having same length N, and the plurality of polar codes comprises a second polar code, wherein the second polar code is generated by polar encoding one or more data bits according to the second index set obtained from the common index set.

16. The non-transitory, computer-readable medium according to claim 15, wherein the common index set is a union of index sets respectively corresponding to all polar codes in the plurality of polar codes.

17. The non-transitory, computer-readable medium according to claim 15, wherein the first polar code and the second polar code have different code rates.

18. The non-transitory, computer-readable medium according to claim 15, wherein the plurality of polar codes form a group of polar codes, which is one of m groups of polar codes, and wherein there is a recurrence relation among common index sets corresponding respectively to the m groups of polar codes, wherein m is greater than or equal to 2.

* * * * *